(12) United States Patent
Beckenbaugh et al.

(10) Patent No.: US 7,707,522 B2
(45) Date of Patent: Apr. 27, 2010

(54) AUTO-ROUTING SMALL JOG ELIMINATOR

(75) Inventors: Mark R. Beckenbaugh, Rochester, MN (US); Michael D. Cesky, Rochester, MN (US); Jay A. Lawrence, Rochester, MN (US); Lily L. Wang, Rochester, MN (US); Nicholas G. Young, Rochester, MN (US); John W. Zack, Rochester, MN (US); Laura M. Zumbrunnen, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 162 days.

(21) Appl. No.: 11/939,761

(22) Filed: Nov. 14, 2007

(65) Prior Publication Data

US 2009/0125860 A1 May 14, 2009

(51) Int. Cl.
*G06F 17/50* (2006.01)

(52) U.S. Cl. .................................. 716/1; 716/13; 716/19

(58) Field of Classification Search ...................... 716/1, 716/13, 19

See application file for complete search history.

(56) References Cited

U.S. PATENT DOCUMENTS

| | | | | |
|---|---|---|---|---|
| 5,353,235 A | * | 10/1994 | Do et al. | 716/14 |
| 5,740,068 A | * | 4/1998 | Liebmann et al. | 716/21 |
| 6,519,751 B2 | * | 2/2003 | Sriram et al. | 716/13 |
| 2002/0170029 A1 | * | 11/2002 | Sriram et al. | 716/13 |
| 2006/0085773 A1 | * | 4/2006 | Zhang | 716/4 |

* cited by examiner

*Primary Examiner*—Jack Chiang
*Assistant Examiner*—Suchin Parihar
(74) *Attorney, Agent, or Firm*—Bockhop & Associates LLC

(57) ABSTRACT

In a method of routing a wire to a shape in an integrated circuit for minimizing undesirable jog creation during a masking process, a plurality of possible placements of the wire relative to a selected edge of the shape resulting in the wire being connected to the shape are determined. A cost is assigned to each placement, the cost indicating an amount of jog that would be created in the masking process corresponding to the placement, wherein a greater cost indicates that a greater jog would be created in the masking process than would be created by a placement assigned a lesser cost. A placement having a lowest cost of the plurality of possible placements is selected.

16 Claims, 3 Drawing Sheets

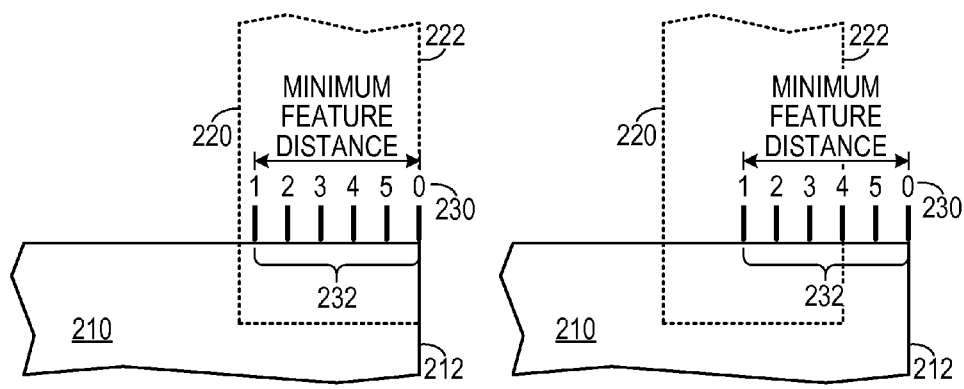
FIG. 2A    FIG. 2B
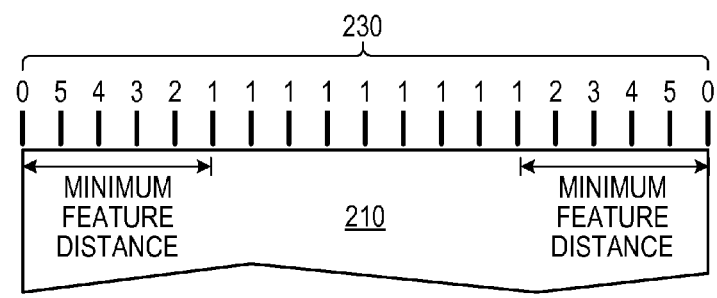
FIG. 2C
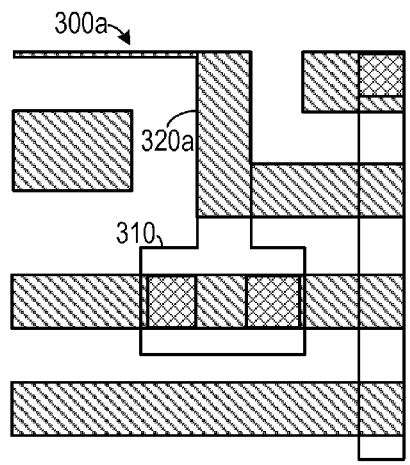 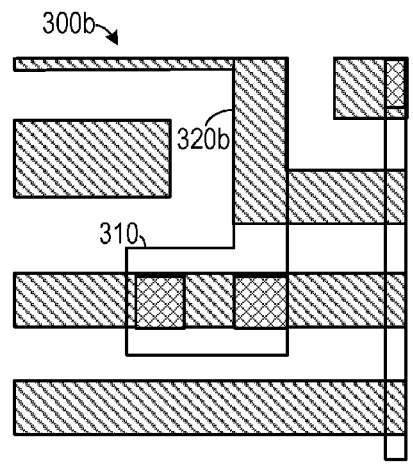
FIG. 3A    FIG. 3B

AUTO-ROUTING SMALL JOG ELIMINATOR

BACKGROUND OF THE INVENTION

1. Field of the Invention

The present invention relates to wiring layout systems for integrated circuits and, more specifically, to a system that minimizes creation of jogs during the masking process.

2. Description of the Prior Art

The process of designing an integrated circuit involves many different levels of abstraction, beginning with the functional specification of the circuit and ending with the layout of regions of dopants, polysilicon and metals on the actual crystal that makes up the circuit. At one level, a auto router wiring tool specifies the routes that wires will take to connect to shapes (such as vias, etc.). After the wiring tool lays out all of the wiring for a chip, a masking tool will create the masks that are used in depositing the materials that form the circuit onto crystal face of the chip.

The masking tool employs a series of rules to maintain the integrity of the chip. Some of these rules are based on the technology being employed and the physical demands placed on the chip. One typical rule is a minimum feature distance requirement. This rule ensures that every wire and shape is wide enough to function properly. In some systems, the minimum feature distance can include the minimum width allowed for a wire or a portion of a shape.

Unfortunately, when an edge of a wire is placed near an edge of a shape at a non-zero distance from the edge of the shape that is less than the minimum feature distance, the masking tool will assume that the part of the width of the portion of the shape between the edge of the wire and the edge of the shape violates the minimum feature distance rule. The masking tool will then add a "jog" to either the shape or the wire (or both) to achieve the minimum feature distance. The creation of jogs is sometimes referred to as the "blooming effect."

This is shown in FIG. 1A, where a couple of wires 30 are connected to a shape 20 (in this case, the shape 20 is used to couple the wires 30 to a pair of vias 22). The resulting shape 40 on the mask created by the masking tool includes several jogs 42a and 42b that the masking tool adds to compensate for rounding of edges in the fabrication process. Some of the jogs (such as 42a) are undesirable because they not necessary to compensate for rounding and introduce extra small edges and corners, which may be detrimental to the yield of the design and require added mask compensation shapes. As shown in FIG. 1B, if the wire 30 is aligned with the shape 20, then some of the jogs 42a are eliminated. Currently, users must manually run a wire straightening program after running the wiring tool to try to reduce the number of jogs. This adds cost to the development process.

Therefore, there is a need for a wire routing tool that connects wires to shapes so as to minimize jogs.

SUMMARY OF THE INVENTION

The disadvantages of the prior art are overcome by the present invention which, in one aspect, is a method of routing a wire to a shape in an integrated circuit for minimizing undesirable jog creation during a masking process, in which a plurality of possible placements of the wire relative to a selected edge of the shape resulting in the wire being connected to the shape are determined. A cost is assigned to each placement, the cost indicating an amount of undesirable jog that would be created in the masking process corresponding to the placement, wherein a greater cost indicates that a greater undesirable jog would be created in the masking process than would be created by a placement assigned a lesser cost. A placement having a lowest cost of the plurality of possible placements is selected.

In another aspect, the invention is a method of routing a wire to a shape in an integrated circuit, in which a plurality of possible placements of the wire relative to a selected edge of the shape resulting in the wire being connected to the shape is determined. An amount of undesirable jog that will be created during a masking process for each of the plurality of possible placements is determined. A placement of the plurality of possible placements that will create a smallest jog during the masking process is selected.

In yet another aspect, the invention is a wire routing system for routing a wire to a shape in an integrated circuit for minimizing undesirable jog creation during a masking process that is configured to execute on a digital computer. A placement generator is configured to generate a plurality of possible placements of the wire relative to a selected edge of the shape resulting in the wire being connected to the shape. A cost generator assigns a cost to each placement. The cost indicates an amount of undesirable jog that would be created in the masking process if the placement is chosen. A greater cost indicates that a greater undesirable jog would be created in the masking process than would be created by a placement assigned a lesser cost. A placement selector selects a placement assigned a lowest cost.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

BRIEF DESCRIPTION OF THE FIGURES OF THE DRAWINGS

FIGS. 2A-2C are schematic diagrams demonstrating cost assignment to placements of wires relative to an edge of a shape.

FIGS. 3A-3B are schematic diagrams showing two possible wiring placements.

DETAILED DESCRIPTION OF THE INVENTION

Figure 1A:
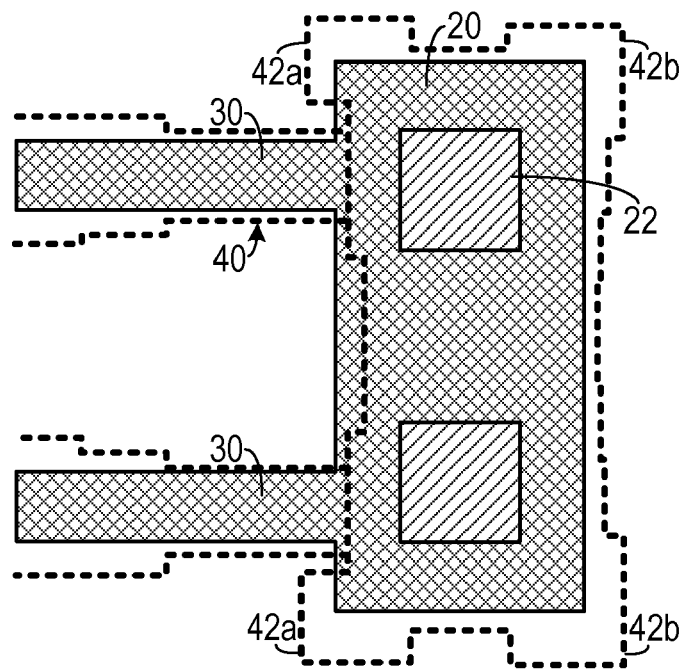
FIG. 1A is a diagram of a wiring prior art placement with a mask overlaid thereon.
Figure 1B:
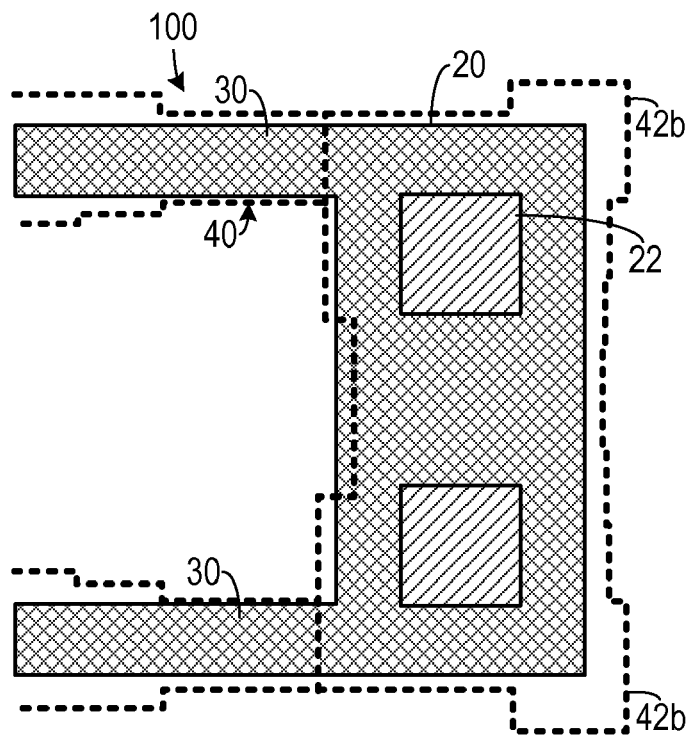
FIG. 1B is a diagram of a second prior art wiring placement.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

As show in FIGS. 2A-2B, in one method (which may be operable on a digital computer as part of an auto router system) for minimizing creation during a masking process, the system determines a plurality of possible placements of a wire 220 relative to a selected edge 212 of a shape 210. A cost 230 is assigned to each placement based on the distance of the outer edge 222 of the wire 220 from the selected edge 212 of the shape 210. (While in the example give, the costs range from 0 to 5, it should be understood that the specific values shown are presented for demonstration purposes only and that other cost assignment schemes will fall within the scope of the claims below.)

The cost 230 assigned indicates the amount of undesirable jog that will be created as a result of the placement. For example, the system could assign a cost of "0" to a placement if the outer edge 222 is flush with the selected edge 212. A placement in which the outer edge 222 is moved slightly away from the selected edge 212 would result in a maximum cost assigned to the placement, since the slight gap between the outer edge 222 and the selected edge 212 would result in the creation of an undesirable jog in the masking process. As the outer edge 222 of the wire 220 moves away from the selected edge 212 of the shape 210, the costs decrease until the outer edge 222 reaches a distance from the selected edge 212 equal to the minimum feature distance. At this distance, the placement is assigned a minimum non-zero cost and each placement beyond the minimum feature distance is also assigned the minimum non-zero cost (which, in the example shown in FIG. 2C, is "1").

Once the costs are assigned to each of the possible placements, the possible placement with the lowest cost is selected. In certain situations, a placement assigned a lowest cost might not be possible because of interactions with other placements. In such a situation, the placement assigned a next lowest cost will be selected.

In the examples shown in FIGS. 2A-2C, the wire 220 can exist at predefined quantum distances 232 from the edge of a shape 210. In this situation, each quantum distance 232 is assigned a corresponding quantum cost 230 (0-5 in the examples shown).

A less-than-preferred routing 300a is shown in FIG. 3A, in which a wire 320a is routed to the center of a shape 310. A more preferable routing 300b is shown in FIG. 3B, in which the wire 320b is routed so as to be flush with the selected edge of the shape 310.

Figure 4:
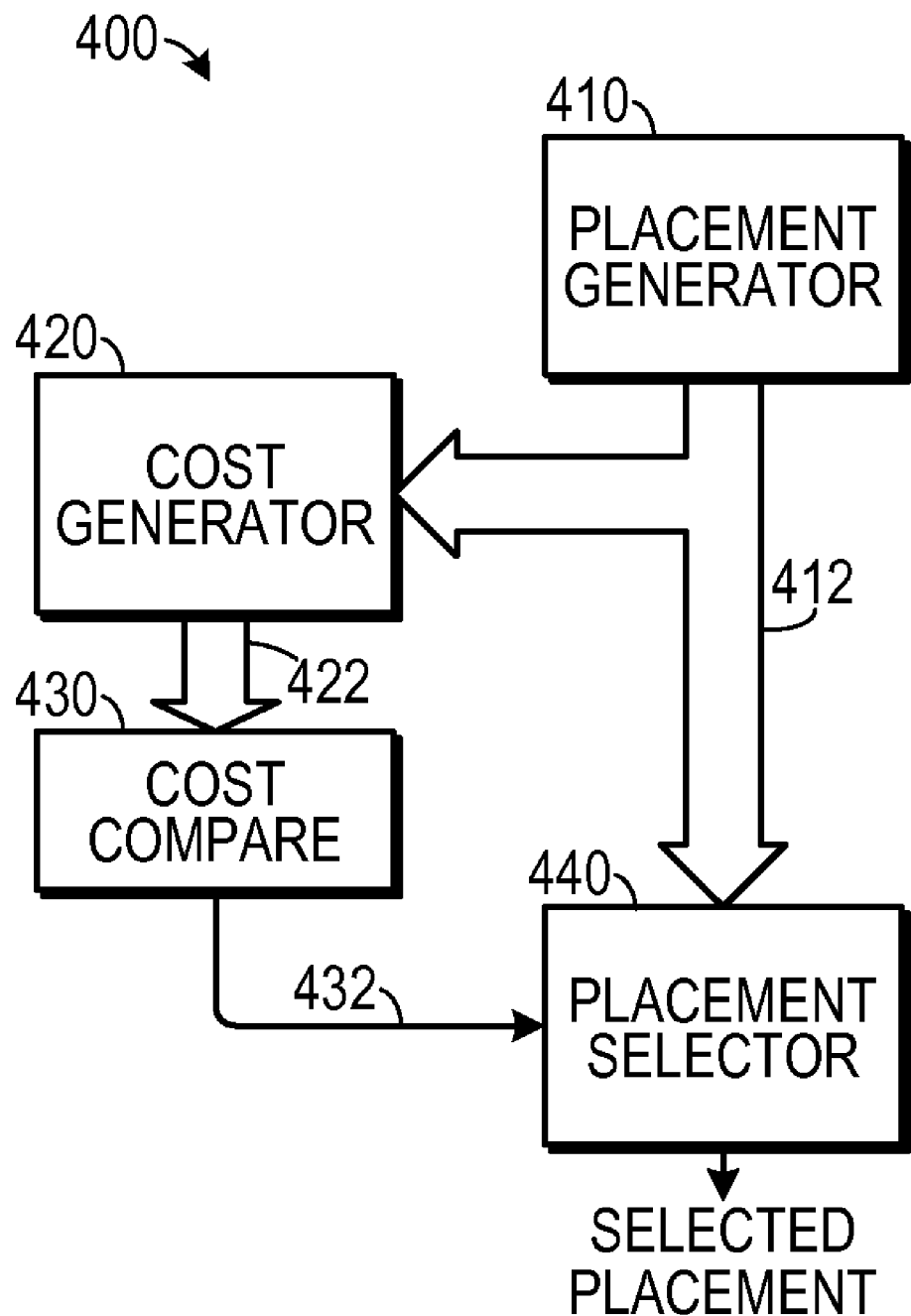
FIG. 4 is a block diagram of a system for generating a wire placement.

A wire routing system 400 as shown in FIG. 4, may be embodied according to the methods disclosed above in an auto router. Such a system would include a placement generator 410 that generates a plurality of possible placements 412 of the wire. A cost generator 420 assigns a cost 422 to each placement 412. A cost compare module 430 compares the cost of each placement 412 and generates an indication 432 of which placement 412 has the lowest cost. Based on the indication 432, a placement selector 440 selects the desired placement.

Jog may be minimized using a method that may be integrated into the auto router and that places a weighted cost to creating a short edge or a small jog. The system eliminates or reduces the occurrence of small jogs at a time where they are normally created by an auto router, instead of during post processing. While existing systems attempt to connect two points with the shortest path possible, the wire routing system 400 disclosed above allows a wire to stray from the shortest path based on costs that are assigned by the cost generator 420.

When the auto router starts creating the wire, it is preferable that the edge of the wire line up with the edge of the target shape of the same metal. When the router places a via cell to change to an adjacent metal level, it is desirable that the via cell's edges to line up with the existing wire's edge. An advantages of this system is that it tends to minimize the extra steps of manually having to fix the undesirable shapes created in the process of wiring circuits with an auto routing tool.

In one embodiment, this system would employ weighting. A cost of zero is placed at the edge or corner of the target shape where the wire's edge would line up with the target. Cost then increases as a step function one step from the edge and then decrease as the placement moves away from the edge of the target shape until it is far enough away so as not to create a jog. The method may be iterative in nature and would be integrated into the router such that if an iteration of the method fails, information is fed back to the router so a new edge on the shape could be selected or if no other routes can be found a qualitative value regarding a placement would be available to the router so it can pick the least costly solution.

The edge the router selects would be evaluated based on the ground rules of the auto router that describe a short edge rule. For example, the auto router might assign costs to the wires as a result of the wire changing directions (a straight wire being desirable in may situations). The system will consider both the costs associated with jog creation and the costs associated with bending the wire to avoid jog creation. Each edge on the shape can be converted in to a weighted graph and the router will pick a region on that graph to minimize the cost of that route. The graph would only contribute part of the cost of the route with the router determining other factors such as: zero width wires; minimum spacing between shapes; the edge of the shape was greater than the width of the wire; and blockages along the edge. If conditions are met; a graph is created based on a weight of zero at both endpoints, a "no wire" region starts at (the endpoint+one step size) and extends the width equal to the short-edge ground rule. If the region that is left between the two no wire zones (one at each endpoint of the edge) is greater than the width of the wire, then the graph would vary the weight towards the "wire region" as a function of the short edge ground rule but would never be set to zero thus favoring the endpoints and eliminating the short edges.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A method of routing a wire to a shape in an integrated circuit for minimizing undesirable jog creation during a masking process, comprising the actions of:
   a. using a computer, determining a plurality of possible placements of the wire relative to a selected edge of the shape resulting in the wire being connected to the shape;
   b. assigning a cost to each placement, the cost indicating an amount of undesirable jog that would be created in the masking process corresponding to the placement, wherein a greater cost indicates that a greater undesirable jog would be created in the masking process than would be created by a placement assigned a lesser cost, wherein the assigning a cost action comprises the actions of:
      i. assigning a zero cost to a placement when an outer edge of the wire is flush with the selected edge of the shape;
      ii. assigning a minimum non-zero cost to a placement when the outer edge of the wire is at least a minimum feature distance away from the selected edge of the shape; and iii. assigning a cost greater than the minimum non-zero cost to a placement when the outer edge of the wire is not flush with the selected edge of the shape and is less than the minimum feature distance away from the selected edge of the shape; and c. selecting a placement having a lowest cost of the plurality of possible placements.

2. The method of claim 1, wherein the cost is greatest as the outer edge of the wire approaches the selected edge of the shape and decreases to the minimum non-zero cost as the outer edge of the wire approaches the minimum feature distance away from the selected edge of the shape.

3. The method of claim 1, wherein the minimum feature distance equals a minimum width allowable for the wire.

4. The method of claim 1, wherein the action of assigning a cost greater than the minimum cost comprises the actions of:
  a. defining plurality of quantum distances from the selected edge of the shape to the outer edge of the wire; and
  b. assigning a quantum cost to each of the plurality of quantum of distances so that each quantum distance is assigned a correspondingly increased quantum cost above the minimum non-zero cost as the quantum distance between outer edge of the wire and the selected edge of the shape approaches a minimum non-zero quantum distance.

5. The method of claim 1, adapted to execute on a digital computer.

6. The method of claim 1, adapted to be part of an auto-router.

7. A method of routing a wire to a shape in an integrated circuit, comprising the actions of:
  a. using a computer, determining a plurality of possible placements of the wire relative to a selected edge of the shape resulting in the wire being connected to the shape;
  b. determining an amount of undesirable jog that will be created during a masking process for each of the plurality of possible placements, wherein the action of determining an amount of undesirable jog comprises the action of assigning a cost to each placement, the cost indicating an amount of undesirable jog that would be created in the masking process if the placement is selected, wherein a greater cost indicates that a greater undesirable jog would be created in the masking process than would be created by a placement assigned a lesser cost, wherein the assigning a cost action comprises the actions of:
    i. assigning a zero cost to a placement when an outer edge of the wire is flush with the selected edge of the shape;
    ii. as signing a minimum non-zero cost to a placement when the outer edge of the wire is at least a minimum feature distance away from the selected edge of the shape; and
    iii. assigning a cost greater than the minimum non-zero cost to a placement when the outer edge of the wire is not flush with the selected edge of the shape and is less than the minimum feature distance away from the selected edge of the shape; and
  c. selecting a placement of the plurality of possible placements that will create a smallest amount of undesirable jog during the masking process.

8. The method of claim 7, wherein the minimum feature distance equals a minimum width allowable for the wire.

9. The method of claim 7, wherein the cost is greatest as the outer edge of the wire approaches the selected edge of the shape and decreases to the minimum non-zero cost as the outer edge of the wire approaches the minimum feature distance away from the selected edge of the shape.

10. The method of claim 7, wherein the action of assigning a cost greater than the minimum cost comprises the actions of:
  a. defining plurality of quantum distances from the selected edge of the shape to the outer edge of the wire; and
  b. assigning a quantum cost to each of the plurality of quantum of distances so that each quantum distance is assigned a correspondingly increased quantum cost above the minimum non-zero cost as the quantum distance between outer edge of the wire and the selected edge of the shape approaches a minimum non-zero quantum distance.

11. The method of claim 7, adapted to execute on a digital computer.

12. The method of claim 7, adapted to be part of an auto-router.

13. A wire routing system, configured to execute on a digital computer, for routing a wire to a shape in an integrated circuit for minimizing undesirable jog creation during a masking process, comprising:
  a. a placement generator configured to generate a plurality of possible placements of the wire relative to a selected edge of the shape resulting in the wire being connected to the shape;
  b. a cost generator that assigns a cost to each placement, the cost indicating an amount of undesirable jog that would be created in the masking process if the placement is chosen, wherein a greater cost indicates that a greater undesirable jog would be created in the masking process than would be created by a placement assigned a lesser cost, wherein the cost generator is configured to:
    i. assign a zero cost to a placement when an outer edge of the wire is flush with the selected edge of the shape;
    ii. as sign a minimum non-zero cost to a placement when the outer edge of the wire is at least a minimum feature distance away from the selected edge of the shape; and
    iii. assign a cost greater than the minimum non-zero cost to a placement when the outer edge of the wire is not flush with the selected edge of the shape and is less than the minimum feature distance away from the selected edge of the shape; and
  c. a placement selector that selects a placement assigned a lowest cost.

14. The wire routing system of claim 13, wherein the cost is greatest as the outer edge of the wire approaches the selected edge of the shape and decreases to the minimum non-zero cost as the outer edge of the wire approaches the minimum feature distance away from the selected edge of the shape.

15. The wire routing system of claim 13, wherein to assign a cost greater than the minimum cost, the cost generator is configured to:
  a. define plurality of quantum distances from the selected edge of the shape to the outer edge of the wire; and
  b. assign a quantum cost to each of the plurality of quantum of distances so that each quantum distance is assigned a correspondingly increased quantum cost above the minimum non-zero cost as the quantum distance between outer edge of the wire and the selected edge of the shape approaches a minimum non-zero quantum distance.

16. The wire routing system of claim 13, adapted to be part of an auto-router.

* * * * *